United States Patent
Nam (10) Patent No.: US 7,742,359 B2
(45) Date of Patent: *Jun. 22, 2010

(54) CALIBRATION CIRCUIT OF A SEMICONDUCTOR MEMORY DEVICE AND METHOD OF OPERATING THE SAME

(75) Inventor: Young Jun Nam, Kwangju-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 41 days.

This patent is subject to a terminal disclaimer.

(21) Appl. No.: 12/076,682

(22) Filed: Mar. 21, 2008

(65) Prior Publication Data

US 2008/0181045 A1 Jul. 31, 2008

Related U.S. Application Data

(63) Continuation of application No. 11/167,683, filed on Jun. 28, 2005, now Pat. No. 7,369,455.

(30) Foreign Application Priority Data

Dec. 30, 2004 (KR) .................... 10-2004-117050

(51) Int. Cl.
*G11C 8/00* (2006.01)
(52) U.S. Cl. .............. 365/230.08; 365/201; 365/189.05
(58) Field of Classification Search ............ 365/230.08, 365/201, 189.05
See application file for complete search history.

(56) References Cited

U.S. PATENT DOCUMENTS

| | | | |
|---|---|---|---|
| 5,894,081 A | 4/1999 | Ashuri | |
| 5,996,415 A | 12/1999 | Stanke et al. | |
| 6,182,510 B1 | 2/2001 | Stanke et al. | |
| 6,434,081 B1 * | 8/2002 | Johnson et al. | 365/233.14 |
| 7,019,556 B2 | 3/2006 | Yoo | |
| 7,369,455 B2 * | 5/2008 | Nam | 365/230.08 |

FOREIGN PATENT DOCUMENTS

| | | |
|---|---|---|
| CN | 1035698 | 8/1997 |
| CN | 1389872 | 1/2003 |
| JP | 10173616 | 6/1998 |
| JP | 2003036674 | 2/2003 |

OTHER PUBLICATIONS

Notice of Allowance for parent U.S. Appl. No. 11/167,683 dated Dec. 21, 2007.
Patent Gazette dated Sep. 16, 2009, for Chinese application No. 200510089661.7.

* cited by examiner

*Primary Examiner*—Son Dinh
*Assistant Examiner*—Nam Nguyen
(74) *Attorney, Agent, or Firm*—Lowe Hauptman Ham & Berner, LLP (57) ABSTRACT

A calibration circuit for a semiconductor device and a method of driving the same. The calibration circuit includes a PRBS generator in which a data pattern is generated within an integrated circuit without receiving data from the outside, a PRBS tester that compares output signals of a data latch that strobes and latches an output signal of a data input buffer to determine whether the interlock operation of data and strobe is pass or fail, and a calibration unit that calibrates a delay time using the output signal of the PRBS tester as much as a predetermined unit. Thus, variation in process, voltage, temperature, etc. can be freely calibrated even after package assembly. Accordingly, it is possible to guarantee a set-up/hold value that is necessary for high frequency operation of a system, and to reduce the time and resources necessary for product manufacture and for calibrating these values.

27 Claims, 5 Drawing Sheets

CALIBRATION CIRCUIT OF A SEMICONDUCTOR MEMORY DEVICE AND METHOD OF OPERATING THE SAME

CROSS REFERENCE TO RELATED APPLICATION

This application is a Continuation of U.S. Ser. No. 11/167,683, filed on Jun. 28, 2005 now U.S. Pat. No. 7,369,455. This application, in its entirety, is incorporated herein by reference.

BACKGROUND

1. Field of the Invention

The present invention relates to a calibration circuit of a semiconductor device and a method of driving the same, and more specifically, the present invention relates to a calibration circuit for a semiconductor device and a method of driving the same, wherein a set-up/hold value can be secured regardless of variations in process, voltage or temperature in such a manner that data are internally input if the set-up/hold value is not compatible with an operating frequency condition, whether the interlock of data and strobe is pass or fail is checked, and delay times are sequentially controlled depending on the check result.

2. Discussion of Related Art

In the process of fabricating a semiconductor device, after the element is formed on a wafer, a tuning work using a fuse option is implemented in order to control an operating margin and an internal operating voltage of a product depending upon variation in process or device, and is package-assembled to finish a single memory unit. Since it is difficult to replicate the operating frequency at which an actual memory operates before package assembly, a set-up/hold value necessary for the interface, such as data, commands, and address pins being an interface channel with the outside, which is held by a single memory unit of a so-called package character is secured by testing the memory at the operating frequency at which an actual memory device operates after the package assembly. The set-up/hold value is an indispensable condition that must be secured in order to guarantee high speed in an integrated circuit that transmits data or information through a data bus line.

Figure 10:
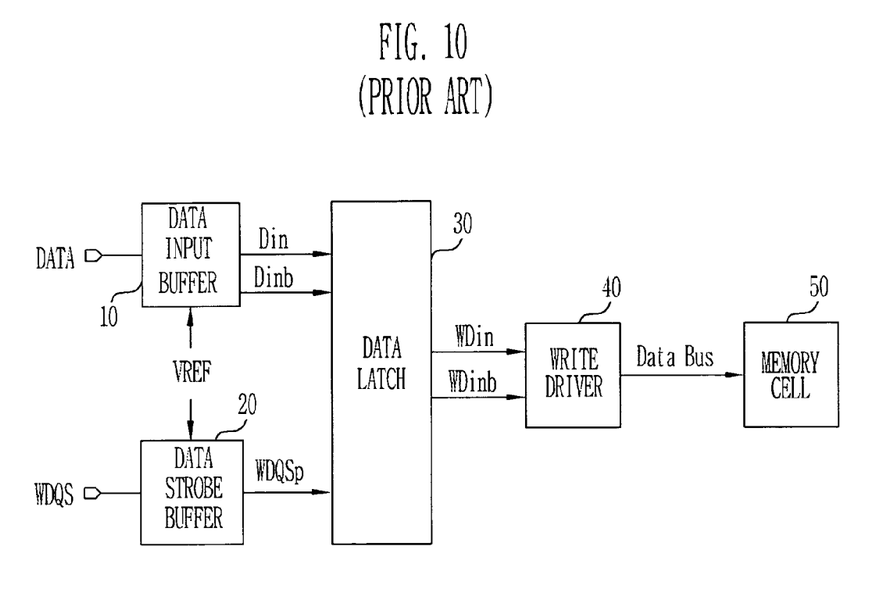
FIG. 10 is a block diagram for explaining a conventional calibration circuit for a semiconductor device.

FIG. 10 is a block diagram for explaining a calibration circuit of a semiconductor device in the prior art.

A data input buffer 10 compares data DATA and a reference voltage VREF, and outputs output signals Din and Dinb depending upon the comparison result.

A data strobe buffer 20 transfers a data strobe signal WDSQ to a data latch 30.

The data latch 30 latches the signals Din and Dinb from the data input buffer 10 according to a signal WDQSp from the data strobe buffer 20, and outputs output signals WDin and WDinb.

A write driver 40 writes the data WDin and Wdinb output from the data latch 30 into a memory cell 50 through a data bus.

In the conventional calibration circuit of the semiconductor device constructed above, in the case where a set-up/hold value needs to be tuned, it is required that a difference between the data and the strobe signal that are input to the data latch 30 be calibrated by controlling the delay option of the data input buffer 10, and a circuit be calibrated accordingly by performing a frequency test after package assembly. If variation in process or device occurs, however, these processes have to be performed from the start. Accordingly, there is a disadvantage in that a great deal of time and resources are wasted.

SUMMARY OF THE INVENTION

Accordingly, the present invention has been made in view of the above problems, and it is an object of the present invention to provide a calibration circuit for a semiconductor device and a method of driving the same, wherein a calibration time can be reduced in such a manner that data are input internally not externally if a set-up/hold value is not compatible with an operating frequency condition.

Another object of the present invention is to provide a calibration circuit for a semiconductor device and a method of driving the same, wherein a set-up/hold value can be secured regardless of variation in process, voltage, or temperature in such a manner that data are internally input if the set-up/hold value is not compatible with an operating frequency condition, whether the interlock of data and strobe is pass or fail is checked, and delay times are sequentially controlled depending on the check result.

To achieve the above objects, according to an aspect of the present invention, there is provided a calibration circuit for a semiconductor device, including a data input buffer that calibrates output times of input data, a data latch that latches the input data according to a data strobe, a data generator for loading an initial setting value according to an enable signal, shifting the loaded setting value according to a clock signal to generate data, and inputting the generated data to the data input buffer, a data tester for loading an initial setting value according to an enable signal, shifting the loaded setting value according to a clock signal to generate data, comparing the generated data with the output data of the data latch, and generating a predetermined flag signal according to the comparison result, and a calibration unit for generating a predetermined pulse according to a flag signal and a reset signal, generating a plurality of shift signals according to the pulse, and calibrating the data output time of the data input buffer according to the pulse.

The data input buffer may include a comparator that compares the input data and a reference voltage, and a delay unit that calibrates a delay path of the output signal of the comparator according to the plurality of the shift signals.

The delay unit may include a plurality of delay means that delays the output signal of the comparator, and a plurality of switching means respectively connected to output terminals of the plurality of the delay means and driven according to the plurality of the shift signals, respectively, to set a delay path.

The data latch may include a comparator for comparing the output data of the data input buffer according to the data strobe to output a predetermined signal, and a latch for latching the output signal of the comparator to output a predetermined signal.

The data generator may include a setting unit for setting an initial value, a plurality of linear feedback shift registers for loading an initial setting value according to the enable signal, shifting the loaded setting value according to the clock signal, and inputting the generated data to the data input buffer, a logic unit for logically combining the output of a last linear feedback shift register, and inputting the results to a first linear feedback shift register.

The linear shift register may include adders for loading initial values of the setting unit according to the enable signal, and adding the loaded values and output values of linear shift registers in a previous stage, and flip-flops that output the output signals of the adder according to the clock signal.

The logic unit may include an XOR gate that receives the output signal of the adder and the output signal of the flip-flop of the last linear shift register.

The data tester may include a setting unit for setting an initial value, a plurality of linear feedback shift registers for loading an initial setting value according to the enable signal, and shifting the loaded setting value according to the clock signal, a first logic unit for logically combining the output of the last linear feedback shift register, and inputting the result to the first linear feedback shift register, and a second logic unit for logically combining the output signal of the first logic unit and an output signal of the data latch, and the flag signal according to the clock signal.

The linear shift register may include adders for loading initial values of the setting unit according to the enable signal, and adding the loaded values and output values of linear shift registers in a previous stage, and flip-flops that output the output signals of the adder according to the clock signal.

The first logic unit may include an XOR gate that receives the output signal of the adder and the output signal of the flip-flop of the last linear shift register.

The second logic unit may include an XOR gate for logically combining the output signal of the first logic unit and the output signal of the data latch, and a flip-flop for outputting the output signal of the XOR gate according to the clock signal, thus generating the flag signal.

The calibration unit may include a pulse generator that generates a reset pulse and a flag pulse according to the reset signal and the flag signal, and a shift unit for generating a plurality of shift signals that sequentially transit according to the reset pulse and the flag pulse.

The pulse generator may include a first inversing delay unit that inverts and delays the reset signal, a first NAND gate that uses the reset signal and the output signal of the first inversing delay unit to generate the reset pulse, a second inversing delay unit that inverts and delays the flag signal, and a second NAND gate that uses the flag signal and the output signal of the second inversing delay unit to generate the flag pulse.

The shift unit may include a plurality of shifters, wherein the shift signal that does not pass through the shifters is output at an initial state, and whenever the reset pulse and the flag pulse are enabled, the plurality of the shifters are sequentially driven to output the plurality of the shift signals in a sequential manner.

The shifters may include a first transfer gate for transferring an input signal according to the flag pulse, a latch for latching the signal output from the first transfer gate, a second transfer gate that operates alternately with the first transfer gate according to the flag pulse to transfer the output signal of the latch, and a NAND gate for receiving the reset signal and the signal output from the second transfer gate.

According to another aspect of the present invention, there is provided a calibration circuit for a semiconductor device, including a data input buffer that calibrates output times of input data, a data latch for latching data output from the data input buffer according to a data strobe, a data generator for generating data according to an enable signal, and inputting the generated data to the data input buffer, a tester for generating data according to the enable signal, and comparing the generated data and the output data of the data latch to test the interlock operation of the data and strobe, and a calibration unit for generating a plurality of shift signals according to the output signal of the tester, and calibrating an data output time of the data input buffer according to the shift signals.

According to still another aspect of the present invention, there is provided a method of driving a calibration circuit for a semiconductor device, including the steps of (a) allowing a data input buffer to compare externally input data and a reference voltage and to output the resulting data through an initial delay path, (b) allowing a data latch to latch the output data of the data input buffer according to a data strobe, (c) storing the output data of the data latch in a memory cell to measure a set-up/hold value, (d) if the set-up/hold value is not compatible with an operating frequency condition, loading an initial setting value onto a plurality of linear feedback shift registers constituting a data generator and a data tester according to an enable signal, and shifting the value loaded onto the linear feedback shift registers according to a clock signal, (e) inputting an output data of a last linear feedback shift register of the data generator as input data of the data input buffer, (f) allowing the data input buffer to compare input data of the data generator and the reference voltage, and to output the resulting data through a delay path, (g) allowing a data latch to latch the output data of the data input buffer according to a data strobe, (h) comparing output data of a last linear feedback shift register of the data tester and output data of the data latch, and outputting the resulting flag signal according to the clock signal, (i) generating a flag pulse and a reset pulse according to the flag signal and the reset signal, and (j) generating a plurality of shift signals that sequentially transit according to the flag pulse and the reset pulse, and calibrating delay times of an output signal of the data input buffer according to the shift signal, thus calibrating a set-up/hold value.

DETAILED DESCRIPTION OF PREFERRED EMBODIMENTS

Embodiments according to the present invention will be described with reference to the accompanying drawings.

Figure 1:
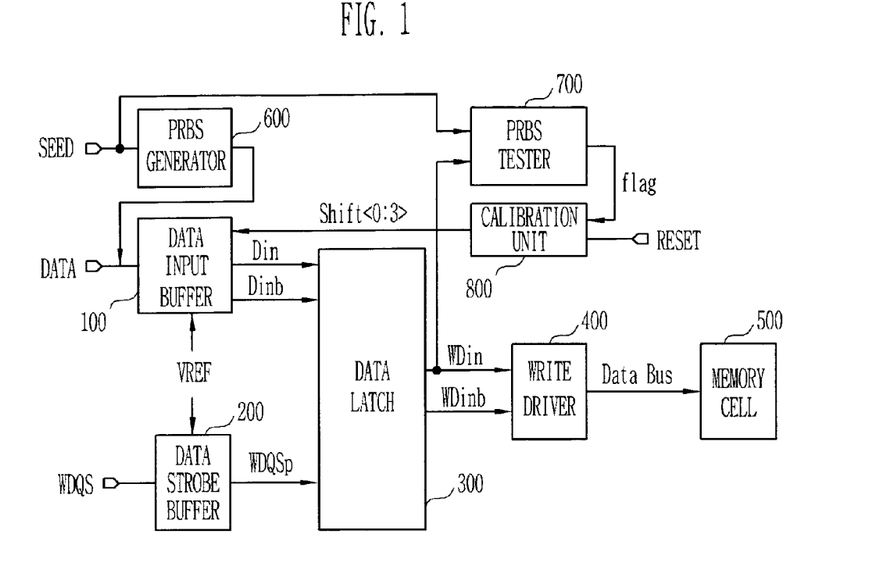
FIG. 1 is a block diagram showing a calibration circuit for a semiconductor device according to an embodiment of the present invention.

FIG. 1 is a block diagram showing a calibration circuit for a semiconductor device according to an embodiment of the present invention.

Referring to FIG. 1, a data input buffer 100 compares data DATA and a reference voltage VREF, and controls output signals Din and Dinb depending upon the comparison result to be output so that their delay paths are controlled by a plurality of shift signals shift<0:3>. Data DATA are initially input from the outside, and are then input within a circuit if a set-up/hold value necessary for data interface is not compatible with an operating frequency condition.

A data strobe buffer 200 transfers a data strobe signal WDSQ to a data latch 300.

The data latch 300 latches the signals Din and Dinb from the data input buffer 100 according to a signal WDQSp from the data strobe buffer 200, and outputs output signals WDin and WDinb.

A write driver 400 stores the data WDin and WDinb output from the data latch 300 in a memory cell 500 through a data bus.

A pseudo random bit sequence (hereinafter, referred to as "PRBS") generator 600 includes a plurality of linear feedback shift registers (hereinafter, referred to as "LFSR") respectively consisting of an adder and a flip-flop. After an initial value is loaded onto the adder, the generator 600 shift-writes the value loaded onto each LFSR according to a clock signal CLK, and inputs the value of the last LFSR as the data DATA of the data input buffer 100.

A PRBS tester 700 includes a plurality of LFSRs respectively consisting of an adder and a flip-flop. The tester 700 loads an initial value onto the adder, and shift-writes the value loaded onto each LFSR according to a clock signal CLK. It also compares a signal in which an output signal of the adder and an output signal of the flip-flop of the last LFSR are logically combined, and the output signal WDin of the data latch 300, and outputs a flag signal "flag" depending upon the interlock operation of the data and the strobe signal. At this time, the flag signal "flag" is output as a low level if the data and the strobe signal are not identical to each other, but is output as a high level if the two signals are identical to each other.

A calibration unit 800 generates a predetermined pulse according to a reset signal RESET and a flag signal "flag" output from the PRBS test unit 700, and generates the shift signals shift<0:3> according to the generated pulse. The delay paths of the output signals Din and Dinb the data input buffer 100 are set by the shift signals shift<0:3>.

Figure 2:
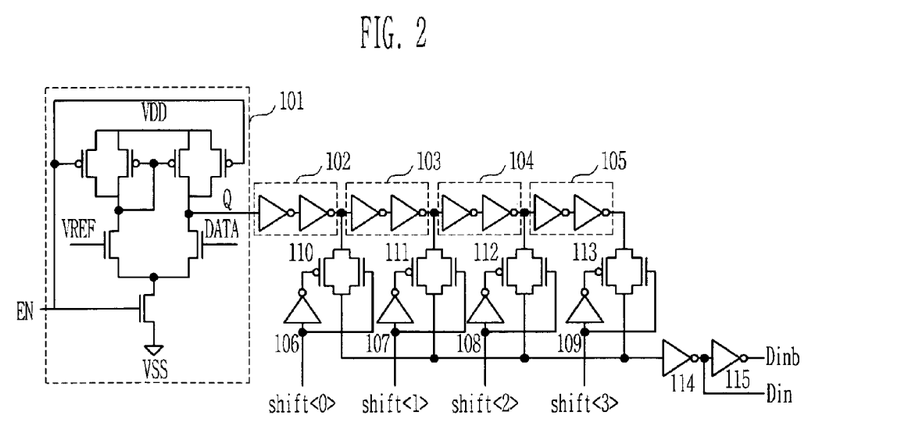
FIG. 2 is a detailed circuit diagram of the data input buffer constituting the calibration circuit for a semiconductor device according to an embodiment of the present invention.

FIG. 2 is a detailed circuit diagram of the data input buffer constituting the calibration circuit for a semiconductor device according to an embodiment of the present invention.

The data input buffer compares the reference voltage VREF and the input data DATA, and allows the output signals Din and Dinb accordingly to be output so that the delay paths are controlled by the plurality of shift signals shift<0:3> output from the calibration unit 800.

A comparator 101 compares the reference voltage VREF and the input data DATA according to an enable signal EN. If an electric potential of the input data DATA is higher than the reference voltage VREF, an output terminal Q is kept to a low level. If an electric potential of the input data DATA is lower than the reference voltage VREF, the output terminal Q is kept to a high level. At this time, the data DATA are initially input from the outside, but data output from the PRBS generator 600 are input from the inside. The voltage level of the output terminal Q of the comparator 101 has its delay time decided by a plurality of delay units 102 to 105. Each of the plurality of the delay units 102 to 105 can be constructed of, for example, a plurality of inverters. However, the delay times through the plurality of the delay units 102 to 105 are decided by transfer gates 110 to 113, which are respectively driven according to the plurality of the shift signals shift<0:3> and shift signals shift<0:3> inverted by the inverters 106 to 109. For example, if the transfer gate 111 is turned on according to the shift signal shift<1> and an inversing signal by the inverter 107, the delay time is decided by the delay units 102 and 103. Meanwhile, the output signal of the delay units 102 to 105 whose the delay path is decided by the transfer gates 110 to 113 is inverted by an inverter 114, and thus becomes the output signal Din. The output signal Din is again inverted by an inverter 115, and thus becomes the output signal Dinb.

Figure 3:
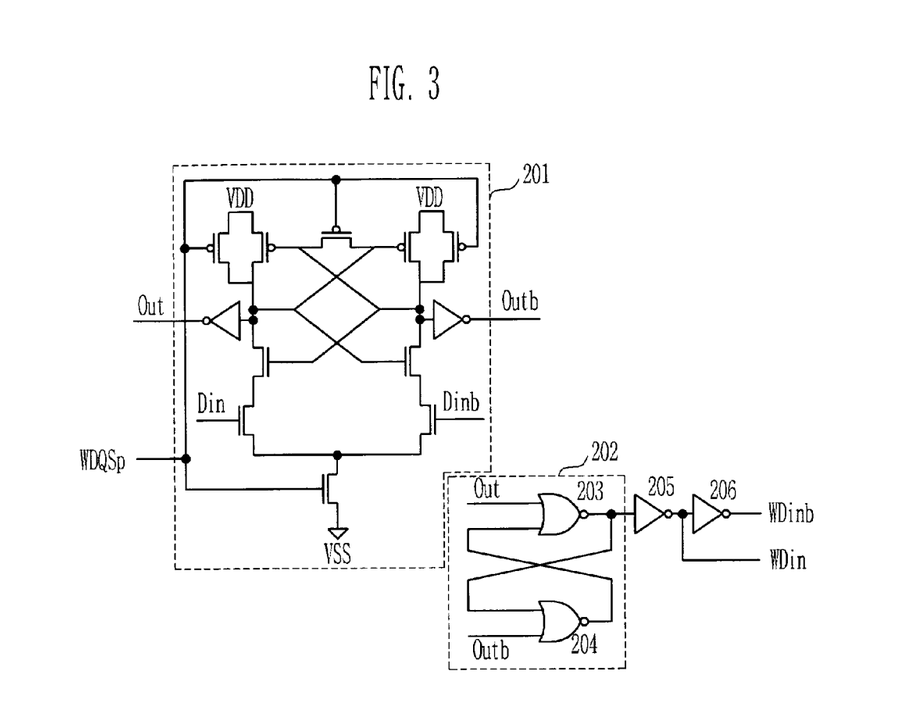
FIG. 3 is a detailed circuit diagram of the data latch constituting the calibration circuit for a semiconductor device according to an embodiment of the present invention.

FIG. 3 is a detailed circuit diagram of the data latch constituting the calibration circuit for a semiconductor device according to an embodiment of the present invention. The data latch latches the signals Din and Dinb from the data input buffer 100 according to the signal WDQSp from the data strobe buffer 200, and outputs the output signals WDin and WDinb.

A comparator 201 compares the signals Din and Dinb from the data input buffer 100 according to the signal WDQSp from the data strobe buffer 200, and outputs signals Out and Outb depending upon the result. If the signal WDQSp from the data strobe buffer 200 is applied as a high level, and an electric potential of the signal Din from the data input buffer 100 is higher than that of the signal Dinb, the signal Out is output as a high level, and the signal Outb is output as a low level. On the contrary, if an electric potential of the signal Din from the data input buffer 100 is lower than that of the signal Dinb, the signal Out is output as a low level, and the signal Outb is output as a high level. The two signals Out and Outb of the comparator 201 are input to a latch 202 consisting of two NOR gates 203 and 204. An output signal of the latch 202 is output as the signal WDin through the inverter 205, and output as the signal WDinb through the inverter 206. That is, if the signal is output as a high level, the signal WDin is also output as a high level. If the signal Outb is a low level, the signal WDinb is also output as a low level.

Figure 4:
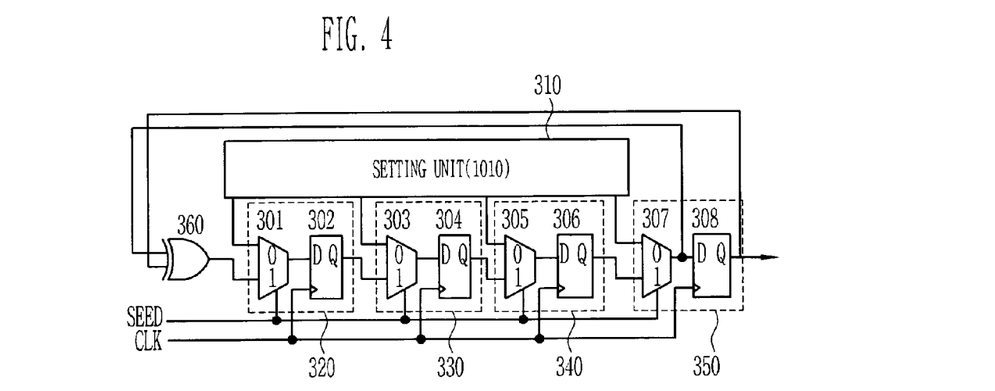
FIG. 4 is a detailed circuit diagram of the PRBS generator constituting the calibration circuit for a semiconductor device according to an embodiment of the present invention.

FIG. 4 is a detailed circuit diagram of the PRBS generator constituting the calibration circuit for a semiconductor device according to an embodiment of the present invention. The PRBS generator is driven according to a signal SEED, which is enabled when a set-up/hold value necessary for data interface is not compatible with an operating frequency condition.

A setting unit 310 loads an initial value according to the enable signal SEED. A plurality of LSFRs 320, 330, 340 and 350 includes an adder 301 and a flip-flop 302, an adder 303 and a flip-flop 304, an adder 305 and a flip-flop 306, an adder 307 and a flip-flop 308, respectively. The adders 301, 303, 305 and 307 add an initial value loaded from the setting unit 310 and the output signal of previous LSFRs 320, 330, 340 and 350, respectively. The flip-flops 302, 304, 306 and 308 transfer the outputs of the adders 301, 303, 305 and 307, respectively, according to a clock signal CLK. An XOR gate 360 logically combines the output signal of the adder 307 of the last LFSR 350 and the output signal of the flip-flop 308.

An initial value, e.g., 1010 is loaded onto the adders 301, 303, 305 and 307, respectively, from the setting unit 310 according to the enable signal SEED. That is, '1' is loaded onto the adder 301, '0' is loaded onto the adder 303, '1' is loaded onto the adder 305, and '0' is loaded onto the adder 307. Furthermore, the adders 301, 303, 305 and 307 add the output signal of a LSFR at a previous stage and the loaded value. Thereafter, the flip-flops 302, 304, 306 and 308 transfer the output signals of the adders 301, 303, 305 and 307 according to the clock signal CLK. As a result, the value loaded onto each LSFR shift-written according to the clock signal CLK. Meanwhile, an XOR gate 360 logically combines the output signal of the adder 307 of the last LSFR 350 and the output signal of the flip-flop 308, and inputs the combination result to the adder 301 of the first LSFR 320.

The output signal of the last LSFR of the PRB generator is input to the data input buffer as the data signal DATA.

Figure 5:
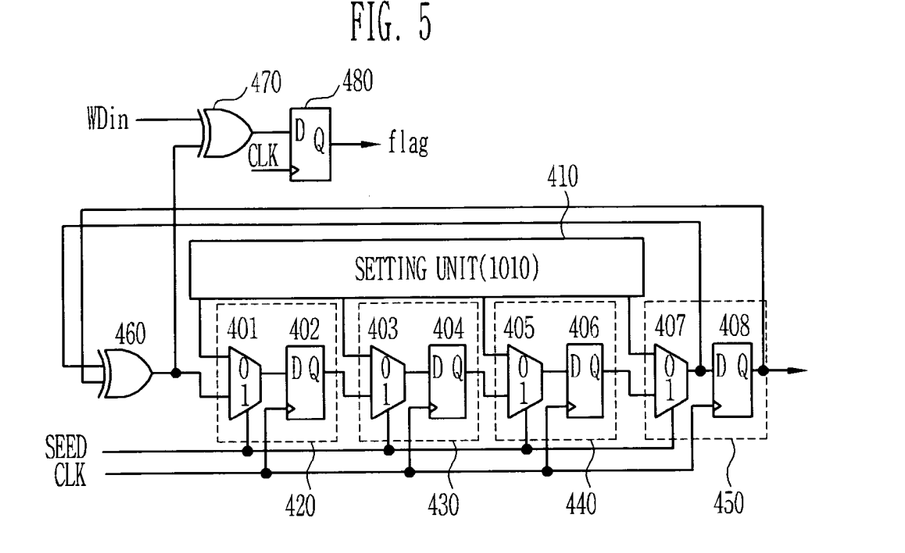
FIG. 5 is a detailed circuit diagram of the PRBS tester constituting the calibration circuit for a semiconductor device according to an embodiment of the present invention.

FIG. 5 is a detailed circuit diagram of the PRBS tester constituting the calibration circuit for a semiconductor device according to an embodiment of the present invention.

A setting unit 410 loads an initial value according to an enable signal SEED. A plurality of LSFRs 420, 430, 440 and 450 includes an adder 401 and a flip-flop 402, The adders 401, 403, 405 and 407 add an initial value loaded from the setting unit 410 and the output signal of previous LSFRs 420, 430, 440 and 450, respectively. The flip-flops 402, 404, 406 and 408 transfer the outputs of the adders 401, 403, 405 and 407, respectively, according to a clock signal CLK. An XOR gate 460 logically combines the output signal of the adder 407 of the last LFSR 450 and the output signal of the flip-flop 408. Furthermore, an XOR gate 470 logically combines an output signal of the XOR gate 460 and an output signal WDin of the data latch 300. A flip-flop 480 transfers an output signal of the EOR gate 470 according to a clock signal CLK, and outputs a flag signal flag.

An initial value, e.g., 1010 is loaded onto the adders 401, 403, 405 and 407, respectively, from the setting unit 410 according to the enable signal SEED. That is, '1' is loaded onto the adder 401, '0' is loaded onto the adder 403, '1' is loaded onto the adder 405, and '0' is loaded onto the adder 407. Furthermore, the adders 401, 403, 405 and 407 add the output signal of a LSFR at a previous stage and the loaded value. Thereafter, the flip-flops 402, 404, 406 and 408 transfer the output signals of the adders 401, 403, 405 and 407 according to the clock signal CLK. As a result, the value loaded onto each LSFR shift-written according to the clock signal CLK. Meanwhile, an XOR gate 460 logically combines the output signal of the adder 407 of the last LSFR 450 and the output signal of the flip-flop 408, and inputs the combination result to the adder 401 of the first LSFR 420, and the EOR gate 470. Furthermore, an XOR gate 470 logically combines an output signal WDin of the data latch 300 and an output signal of the XOR gate 460. The output signal of the XOR gate 470 is input to the flip-flop 480, and is output according to the clock CLK.

Accordingly, the above PRBS tester outputs a pass flag flag of a low level when the output signal of the XOR gate 460 and the output signal WDin of the data latch 300 are identical to each other, and outputs a fail flag flag of a high level when both the signals are not identical to each other. The flag signal flag of the PRBS tester becomes an input signal of the calibration unit 900.

Figure 6:
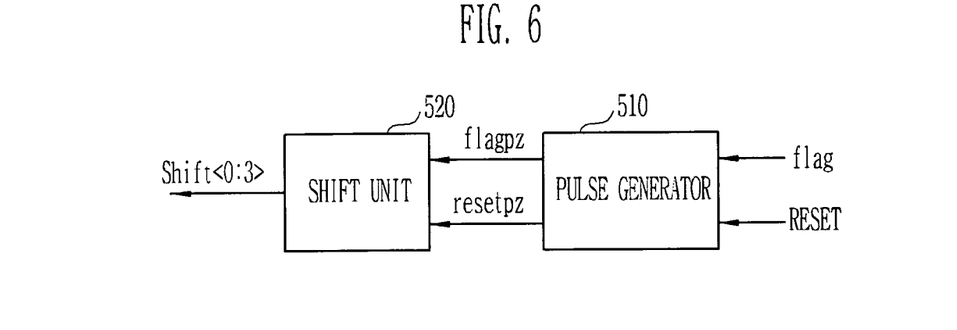
FIG. 6 is a detailed circuit diagram of the calibration unit constituting the calibration circuit for a semiconductor device according to an embodiment of the present invention.

FIG. 6 is a detailed circuit diagram of the calibration unit constituting the calibration circuit of the semiconductor device according to an embodiment of the present invention. The calibration unit includes a pulse generator 510 that generates a predetermined pulse according to the reset signal RESET and the flag signal flag output from the PRBS test unit 700, and a shift unit 520 that generates the shift signals shift<0:3> according to pulses resetpz and flagpz generated from the pulse generator 510.

Figure 7:
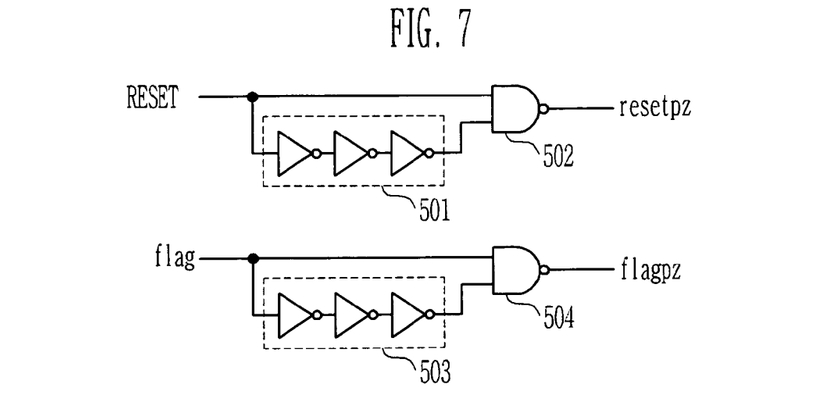
FIG. 7 is a detailed circuit diagram of the pulse generator shown in FIG. 6 according to an embodiment of the present invention.

FIG. 7 is a detailed circuit diagram of the pulse generator shown in FIG. 6 according to an embodiment of the present invention. The pulse generator includes an inversing delay unit 501 that inverts and delays a reset signal RESET, a NAND gate 502 that uses the reset signal RESET and an output signal of the inversing delay unit 501 to generate a predetermined pulse resetpz, an inversing delay unit 503 that inverts and delays a flag signal "flag," and a NAND gate 504 that uses the flag signal flag and the output signal of the inversing delay unit 503 to generate a predetermined pulse flagpz. At this time, the inversing delay units 501 and 503 can be constructed using, for example, an add-number of inverter(s).

The pulse generator constructed above generates the reset pulse resetpz of a low level depending upon a delay time of the inversing delay unit 501 if the reset signal RESET transits from a low level to a high level, and generates the flag pulse flagpz of a low level depending upon a delay time of the inversing delay unit 503 if the flag signal "flag" transits from a low level to a high level.

Figure 8:
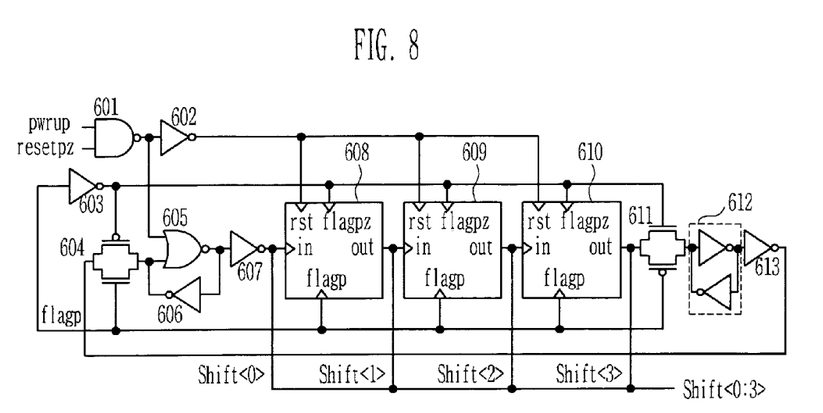
FIG. 8 is a detailed circuit diagram of the shift unit shown in FIG. 6 according to an embodiment of the present invention.

FIG. 8 is a detailed circuit diagram of the shift unit shown in FIG. 6 according to an embodiment of the present invention.

A power-up signal pwrup and a reset pulse resetpz are input to a NAND gate 601, and are then logically combined. An output signal of the NAND gate 601 is inverted by an inverter 602, and is then input to shifters 608, 609 and 610, respectively. An output signal of the shifter 610 is transferred through a transfer gate 611 that is driven according to a flag pulse flagp and an output signal of the inverter 603, and is then inverted through an inverter 613 after being latched by a latch 612. An output signal of the inverter 613 is transferred through a transfer gate 604 that is driven according to the flag pulse flagp and an output signal of the inverter 603, and is then input to a NOR gate 605. The NOR gate 605 logically combines a signal output from the transfer gate 604 and the output signal of the NAND gate 601. The output signal of the NOR gate 605 is inverted by an inverter 606, input to the NOR gate 605 again, inverted by an inverter 607, and thus becomes an input signal of a shifter 608. The shifters 608, 609 and 610 shift input signals in according to flag pulses flagp and flagpz. At this time, the input signal of the shifter 608 is the output signal of the inverter 607, the input signal of the shifter 609 is the output signal of the shifter 608, and the input signal of the shifter 610 is the output signal of the shifter 609. Furthermore, the output signal of the inverter 607 becomes a shift signal shift<0>, the output signal of the shifter 608 becomes a shift signal shift<1>, the output signal of the shifter 609 becomes a shift signal shift<2>, and the output signal of the shifter 610 becomes a shift signal shift<3>.

In the shift unit constructed above, as a reset pulse resetpz keeps a high level at an initial state where a power-up signal pwrup is input as a low level, a reset signal rst is output as a low level, and the shifters 608, 609 and 610 do not operate. Thus, the shift signal shift<0> is output as a high level, and the shift signal shift<1:3> is output as a low level. Further, as the power-up signal pwrup transits to a high level and the shifters 608, 609 and 610 operate according to the reset pulse resetpz and the flag pulses flagp and flagpz, the shift signals shift<1:3> are sequentially output as a high level.

Figure 9:
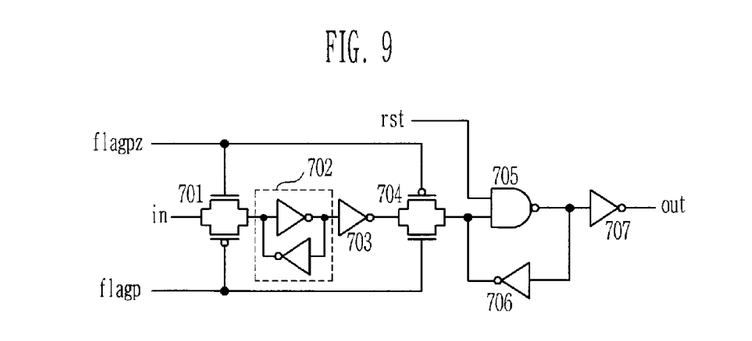
FIG. 9 is a detailed circuit diagram of the shifter shown in FIG. 8 according to an embodiment of the present invention.

FIG. 9 is a detailed circuit diagram of the shifter shown in FIG. 8 according to an embodiment of the present invention.

Transfer gates 701 and 704 alternately operate according to flag pulses flagp and flagpz. An input signal in received through the transfer gate 701 is latched by a latch 702, and the output signal of the latch 702 is inverted by an inverter 703. The output signal of the inverter 703 is input to a NAND gate 705 through a transfer gate 704. The NAND gate 705 performs a NAND operation on a reset signal rst and the output signal of the transfer gate 704. An inverter 706 inverts the output signal of the NAND gate 705, and feedbacks the inverted signal to the NAND gate 705. An inverter 707 inverts the output signal of the NAND gate 705, and outputs an output signal out.

In the shifter constructed above, as the transfer gate 701 is driven according to the flag pulses flagp and flagpz, the input signal in is latched in the latch 702, and the transfer gate 704 is thus driven according to the flag pulses flagp and flagpz. Data of the latch 702 are inverted through the inverter 703, and are then transferred to the NAND gate 705. The NAND gate 705 uses the data received from the transfer gate 704 and the reset signal rst to output a predetermined signal. The signal is inverted by the inverter 707. As a result, the input signal in is shifted and output as the flag pulses flagp and flagpz are toggled.

The construction of the calibration circuit of the semiconductor device and a detailed method of driving respective elements according to the present invention have been described above. An overall method of driving the calibration circuit for a semiconductor device according to the present invention will be below described with the aforementioned construction and method.

At an initial state, as the power-up signal pwrup keeps a low level and the reset pulse resetpz keeps a high level, the reset signal rst is output as a low level, and the shifters constituting the calibration unit 800 do not operate accordingly. Thus, the shift signal shift<0> is output as a high level, and the shift signals shift<1:3> are output as a low level. The data input buffer 100 compares externally input data DATA and the reference voltage VREF, and outputs the signals Din and Dinb as a delay path by the delay unit 102 is set by the transfer gate 110 that operates the shift signal shift<0> of a high level. The data latch 300 latches the signals Din and Dinb output from data input buffer 100 and according to the signal WDQSp output from the data strobe buffer 200, and outputs the output signals WDin and WDinb. The write driver 400 stores the data WDin and WDinb output from the data latch 300 in the memory cell 500 through the data bus.

At this time, in the case where a set-up/hold value necessary for the data interface is not compatible with an operating frequency condition, the enable signal SEED of the PRB generator 600 is enabled according to the MRS or EMRS operating code, and loads an initial setting value onto the plurality of the LFSRs constituting the PRB generator 600. Further, the values of the LFSRs are written according to the clock signal CLK, and the last LSFR value is input as the data DATA of the data input buffer 200. The data DATA input thus are compared with the reference voltage VREF, and the resulting signals are thus output as the signals Din and Dinb through the delay path set by the shift signals shift<0:3>. Meanwhile, as the PRB generator 600 operates, the PRBS tester 700 is also driven to compare a signal in which the output signal of the adder and the output signal of the flip-flop of the last LFSR are logically combined, and the output signal WDin of the data latch 300, and outputs the resulting flag signal flag. That is, the values loaded onto the PRB generator 600 by means of the enable signal SEED are input as the data DATA of the data input buffer 100 in accordance with the LFSR operation of the clock signal CLK, and are thus output as the output signals Din and Dinb of the data input buffer 100. The output signals Din and Dinb are input to the data latch 300, latched according to the signal WDQSp from the data strobe buffer 200, and then output as the output signals WDin and WDinb. The value loaded onto PRBS tester 700 according to the enable signal SEED among the output signals WDin and WDinb of the data latch 300 is compared with the value transferred through the LFSR operation according to the clock signal CLK. If the two values are identical to each other, the pass flag flag of a low level is output. If not, the fail flag flag of a high level is output.

If the fail flag flag is output as the high level, the flag pulse flagpz is generated from the pulse generator of the calibration unit 800. The signal is input to the shift unit to drive the shifter, so that the shift signal shift<1> is output as a high level. Meanwhile, whenever the flag signal "flag" is output as a high level depending upon the comparison result of the PRBS tester 700, the shift signals shift<1:3> are sequentially output as a high level, thus controlling the output times of the output signals Din and Dinb of the data input buffer 100. Thereby, the set-up/hold value between the data input buffer 100 and the data strobe buffer 200 is calibrated.

As described above, a calibration circuit for a semiconductor device according to the present invention includes a PRB generator in which a data pattern is generated within an integrated circuit without receiving data from the outside, a PRBS tester that compares output signals of a data latch that strobes and latches an output signal of a data input buffer to determine whether the interlock operation of data and strobe is pass or fail, and a calibration unit that calibrates a delay time using the output signal of the PRBS tester as much as a predetermined unit. Thus, variation in process, voltage, temperature, etc. can be freely calibrated even after package assembly. Accordingly, it is possible to guarantee a set-up/hold value necessary for a high frequency operation of a system, and to reduce the cost and time necessary for product manufacture calibration for calibrating these values.

Although the foregoing description has been made with reference to the above embodiments, it is to be understood that changes and modifications of the present invention may be made by the ordinary skilled in the art without departing from the spirit and scope of the present invention and appended claims.

What is claimed is:

1. A calibration circuit for a semiconductor device having a date input buffer, the calibration circuit comprising:
   a data generator for loading an initial setting value according to an enable signal, shifting the loaded setting value according to a clock signal to generate data, and inputting the generated data to the data input buffer;
   a data tester for loading an initial setting value according to an enable signal, shifting the loaded setting value according to a clock signal to generate data, comparing the generated data with the output data of the data input buffer, and generating a predetermined flag signal according to the comparison result; and
   a calibration unit for generating a plurality of shift signals and calibrating the data output time of the data input buffer according to the shift signals.

2. The calibration circuit as claimed in claim 1, wherein the data input buffer comprises:
   a comparator for comparing input data and a reference voltage; and
   a delay unit for calibrating a delay path of the output signal of the comparator according to the plurality of the shift signals.

3. The calibration circuit as claimed in claim 2, wherein the delay unit comprises:
   a plurality of delay means for delaying the output signal of the comparator; and
   a plurality of switching means respectively connected to output terminals of the plurality of the delay means and driven according to the plurality of the shift signals, respectively, for setting a delay path.

4. The calibration circuit as claimed in claim 1, wherein the data generator comprises:

a setting unit for setting an initial value;
a plurality of linear feedback shift registers for loading an initial setting value according to the enable signal, shifting the loaded setting value according to the clock signal, and inputting the generated data to the data input buffer;
a logic unit for logically combining the output of a last linear feedback shift register, and inputting the results to a first linear feedback shift register.

5. The calibration circuit as claimed in claim 4, wherein the linear shift register comprises:
adders for loading initial values of the setting unit according to the enable signal, and adding the loaded values and output values of linear shift registers in a previous stage; and
flip-flops that output the output signals of the adder according to the clock signal.

6. The calibration circuit as claimed in claim 4, wherein the logic unit includes an XOR gate that receives the output signal of the adder and the output signal of the flip-flop of the last linear shift register.

7. The calibration circuit as claimed in claim 1, wherein the data tester comprises:
a setting unit for setting an initial value;
a plurality of linear feedback shift registers for loading an initial setting value according to the enable signal, and shifting the loaded setting value according to the clock signal;
a first logic unit for logically combining the output of the last linear feedback shift register, and inputting the result to the first linear feedback shift register; and
a second logic unit for logically combining the output signal of the first logic unit and an output data of the data input buffer, and the flag signal according to the clock signal.

8. The calibration circuit as claimed in claim 7, wherein the linear shift register comprises:
adders for loading initial values of the setting unit according to the enable signal, and adding the loaded values and output values of linear shift registers in a previous stage; and
flip-flops that output the output signals of the adder according to the clock signal.

9. The calibration circuit as claimed in claim 7, wherein the first logic unit includes an XOR gate that receives the output signal of the adder and the output signal of a flip-flop of the last linear shift register.

10. The calibration circuit as claimed in claim 7, wherein the second logic unit comprises:
an XOR gate for logically combining the output signal of the first logic unit and the output data of the data input buffer; and
a flip-flop for outputting the output signal of the FOR gate according to the clock signal, thus generating the flag signal.

11. The calibration circuit as claimed in claim 1, wherein the calibration unit generates the shift signals according to the flag signal and a reset signal.

12. The calibration circuit as claimed in claim 1, wherein the calibration unit comprises:
a pulse generator for generating a reset pulse and a flag pulse according to a reset signal and the flag signal; and
a shift unit for generating the plurality of shift signals that sequentially transit according to the reset pulse and the flag pulse.

13. The calibration circuit as claimed in claim 12, wherein the pulse generator comprises:

a first inversing delay unit for inverting and delays the reset signal;
a first NAND gate that uses the reset signal and the output signal of the first inversing delay unit to generate the reset pulse;
a second inversing delay unit for inverting and delaying the flag signal; and
a second NAND gate that uses the flag signal and the output signal of the second inversing delay unit to generate the flag pulse.

14. The calibration circuit as claimed in claim 12, wherein the shift unit includes a plurality of shifters, wherein the shift signal that does not pass through the shifters is output at an initial state, and whenever the reset pulse and the flag pulse are enabled, the plurality of the shifters are sequentially driven to output the plurality of the shift signals in a sequential manner.

15. The calibration circuit as claimed in claim 14, wherein the shifters comprises a first transfer gate for transferring an input signal according to the flag pulse;
a latch for latching the signal output from the first transfer gate;
a second transfer gate that operates alternately with the first transfer gate according to the flag pulse to transfer the output signal of the latch; and
a NAND gate for receiving the reset signal and the signal output from the second transfer gate.

16. A calibration circuit for a semiconductor device having a data input buffer, the calibration circuit comprising:
a data generator for generating data according to an enable signal, and inputting the generated data to the data input buffer;
a tester for generating data according to the enable signal, and comparing the generated data and the output data of the data input buffer to test the interlock operation of the data and strobe; and
a calibration unit for generating a plurality of shift signals according to the output signal of the tester, and calibrating an data output time of the data input buffer according to the shift signals.

17. The calibration circuit as claimed in claim 1, further comprising a data latch that latches the output data of the data input buffer according to a data strobe,
wherein output data of the data latch are inputted to the data tester.

18. The calibration circuit as claimed in claim 17, wherein the data latch comprises:
a comparator for comparing the output data of the data input buffer according to the data strobe to output a predetermined signal; and
a latch for latching the output signal of the comparator and outputting a predetermined signal to the data tester.

19. The calibration circuit as claimed in claim 16, wherein the data input buffer comprises:
a comparator for comparing input data and a reference voltage; and
a delay unit for calibrating a delay path of the output signal of the comparator according to the plurality of the shift signals.

20. The calibration circuit as claimed in claim 16, wherein the data generator comprises:
a setting unit for setting an initial value;
a plurality of linear feedback shift registers for loading an initial setting value according to the enable signal, shifting the loaded setting value according to a clock signal, and inputting the generated data to the data input buffer;

a logic unit for logically combining the output of a last linear feedback shift register, and inputting the results to a first linear feedback shift register.

21. The calibration circuit as claimed in claim 20, wherein the linear shift register comprises:
  adders for loading initial values of the setting unit according to the enable signal, and adding the loaded values and output values of linear shift registers in a previous stage; and
  flip-flops that output the output signals of the adder according to the clock signal.

22. The calibration circuit as claimed in claim 16, wherein the data tester comprises:
  a setting unit for setting an initial value;
  a plurality of linear feedback shift registers for loading an initial setting value according to the enable signal, and shifting the loaded setting value according to a clock signal;
  a first logic unit for logically combining the output of the last linear feedback shift register, and inputting the result to the first linear feedback shift register; and
  a second logic unit for logically combining the output signal of the first logic unit and an output data of the data input buffer, and the flag signal according to the clock signal.

23. The calibration circuit as claimed in claim 22, wherein the linear shift register comprises:
  adders for loading initial values of the setting unit according to the enable signal, and adding the loaded values and output values of linear shift registers in a previous stage; and
  flip-flops that output the output signals of the adder according to the clock signal.

24. The calibration circuit as claimed in claim 16, wherein the calibration unit comprises:
  a pulse generator for generating a reset pulse and a flag pulse according to a reset signal and the output signal of the tester; and
  a shift unit for generating the plurality of shift signals that sequentially transit according to the reset pulse and the flag pulse.

25. The calibration circuit as claimed in claim 24, wherein the shift unit includes a plurality of shifters, wherein the shift signal that does not pass through the shifters is output at an initial state, and whenever the reset pulse and the flag pulse are enabled, the plurality of the shifters are sequentially driven to output the plurality of the shift signals in a sequential manner.

26. The calibration circuit as claimed in claim 16, further comprising a data latch that latches the output data of the data input buffer according to a data strobe,
  wherein output data of the data latch are inputted to the data tester.

27. The calibration circuit as claimed in claim 26, wherein the data latch comprises:
  a comparator for comparing the output data of the data input buffer according to the data strobe to output a predetermined signal; and
  a latch for latching the output signal of the comparator and outputting a predetermined signal to the data tester.

* * * * *